United States Patent
Moon

(10) Patent No.: US 7,724,232 B2
(45) Date of Patent: May 25, 2010

(54) DEVICE OF DRIVING DISPLAY DEVICE

(75) Inventor: Seung-Hwan Moon, Yongin (KR)

(73) Assignee: Samsung Electronics Co., Ltd. (KR)

( * ) Notice: Subject to any disclaimer, the term of this patent is extended or adjusted under 35 U.S.C. 154(b) by 1298 days.

(21) Appl. No.: 10/740,163

(22) Filed: Dec. 17, 2003

(65) Prior Publication Data

US 2004/0189584 A1 Sep. 30, 2004

(30) Foreign Application Priority Data

Dec. 17, 2002 (KR) .................. 10-2002-0080815

(51) Int. Cl.
*G09G 3/36* (2006.01)
(52) U.S. Cl. .................. 345/100; 345/92
(58) Field of Classification Search .................. 345/156, 345/100, 92, 76, 87, 93, 98; 307/269
See application file for complete search history.

(56) References Cited

U.S. PATENT DOCUMENTS

| | | | |
|---|---|---|---|
| 4,348,597 A * | 9/1982 | Weber | 327/243 |
| 5,870,071 A | 2/1999 | Kawahata | |
| 5,945,970 A * | 8/1999 | Moon et al. | 345/92 |
| 6,292,163 B1 * | 9/2001 | Nam et al. | 345/100 |
| 6,300,928 B1 * | 10/2001 | Kim | 345/92 |

| 2002/0149318 A1 | 10/2002 | Jeon et al. |

FOREIGN PATENT DOCUMENTS

| CN | 1116752 | 2/1996 |
|---|---|---|
| CN | 1120210 | 4/1996 |
| CN | 1135625 | 11/1996 |
| GB | 2343068 | 4/2000 |
| JP | 2000194312 | 7/2000 |
| JP | 2002169513 | 6/2002 |
| JP | 2003-331594 A | 11/2003 |

(Continued)

OTHER PUBLICATIONS

"TFT-LCDs with Monolithic Multi-Drivers for High Performance Video and Low-Power Text Modes"; Authors: Hajime. Washio, et al.; SID International Symposium Digest of Technical Papres, vol. 32; pp. 276-279 (2001).

(Continued)

*Primary Examiner*—Amare Mengistu
*Assistant Examiner*—Yuk Chow
(74) *Attorney, Agent, or Firm*—Cantor Colburn LLP

(57) ABSTRACT

A driving device of a display device includes a gate driver including a series of shift registers. Each shift register generates an output determined by charging and discharging of a capacitor. The charging of the capacitor is blocked by an output of a next shift register or a signal synchronized with the output of the next shift register or the discharging of the capacitor is blocked by an output of a previous shift register or a signal synchronized with the output of the previous shift register.

17 Claims, 9 Drawing Sheets

FOREIGN PATENT DOCUMENTS

| | | |
|---|---|---|
| KR | 100242244 | 11/1999 |
| KR | 100262403 | 5/2000 |
| KR | 1020010087004 | 9/2001 |
| KR | 1020020066962 | 8/2002 |

OTHER PUBLICATIONS

"A High-Performance Integrated Gate-Line Driver for HDTV Active-Matrix LCDs"; Authors: K. Schleupen, et al.; SID International Symposium Digest of Technical Papers, Vol. Part 1 vol. 24; pp. 891-894 (1993).

"A Poly-Si Defect-Tolerant Scanner for Large Area AMLCDs"; Authors: H. Asada, et al.; IEEE International Solid State Circuits Conference; vol. 36; pp. 198-199 (1993).

European Search Report for Application No. 03029006.8-2205; Dated: Mar. 13, 2006.

Washio et al; "TFT-LCDs with Monolithic Multi-Drivers for High Performance Video and Low-Power Text Modes"; SID Digest, 2001, pp. 276-279.

* cited by examiner

DEVICE OF DRIVING DISPLAY DEVICE

BACKGROUND OF THE INVENTION (a) Field of the Invention

The present invention relates to a device of driving a display device.

(b) Description of the Related Art

A liquid crystal display (LCD) or an electro luminescence (EL) display includes a plurality of pixels arranged in a matrix. Each pixel includes a switching element selectively transmitting data voltages, and the switching element includes a typical tri-terminal element such as a metal-oxide-silicon (MOS) transistor. The display device further includes a plurality of gate lines and a plurality of data lines connected to the switching elements. Each gate line transmits a gate-on voltage for turning on the switching elements to be activated and each data line transmits the data voltages to the pixels via the activated switching elements.

The display device further includes a gate driver applying the gate-on voltage to the gate lines, a data driver applying the data voltages to the data lines, and a signal controller for controlling the gate driver and the data driver.

The gate driver starts outputting the gate-on voltage in response to a vertical synchronization signal from the signal controller such that all the gate lines are sequentially supplied with the gate-on voltage. A conventional gate driver includes a plurality of shift registers connected to the respective gate lines for the application of the gate-on voltage. A first the shift register starts outputting the gate-on voltage synchronized with a clock signal in response to the vertical synchronization start signal, while the shift registers except for the first shift register starts outputting the gate-on voltage synchronized with the clock signal in response to outputs of the previous shift registers. The termination of the output of the gate-on voltage in each shift register is closely related to the start time of output of a next shift register.

This is now described in detail.

Each shift register of a conventional gate driver includes an input SR latch and an output AND gate.

The SR latch has a set input terminal for receiving a previous gate output (i.e., an output of a previous shift register) and a reset input terminal for receiving a next gate output (i.e., an output of a next shift register). The AND gate receives an output of the SR latch and a clock signal and it generates and outputs a gate signal.

The output of the SR latch is low in an initial state where both the previous gate output inputted into the set terminal and the next gate output inputted into the reset terminal are low (or "0"). During the low state of the next gate output, when the previous gate output becomes high (or "1"), the output of the SR latch becomes high. During the low state of the next gate output, the output of the SR latch is kept unchanged even though the previous gate output becomes low again. During the low state of the previous gate output, when the next gate output becomes high, the output of the SR latch becomes low from high. As a result, the output of the SR latch maintains high from the turning point of the previous gate output from low to high to the turning point of the next gate output from low to high, while it becomes low for other times.

The AND gate generates a gate output which has a high value when both the output of the SR latch and the clock signal are high. In detail, the gate output becomes high when the clock signal becomes high from low during the high section of the output of the SR latch, and it becomes low when the clock signal becomes low or the output of the SR latch becomes low.

The conventional gate driver experiences so called a latch-up. The output of the SR latch is well-defined when the set input and the reset input is (0, 0), (1, 0), or (0, 1), respectively, but it is not defined when the set input and the reset input is (1, 1), respectively. Accordingly, there is a problem that the shift register fails to perform a normal operation when both the previous gate output and the next gate output are high due to some reasons.

In particular, the display device selectively receives image signals in various modes and the difference in the image signals in the various modes may make such an abnormal operation during the transition of the image modes.

For example, a period of a data enable signal for defining valid data sections becomes short, or the data enable signal behaves like a valid data section for an invalid data section or vice versa. For the former case, a sufficient reset time of the shift register may not be given, and for the latter case, two of more vertical synchronization start signals are generated or the duration of the vertical synchronization start signal is elongated. These may result in simultaneous output of the gate-on voltage by two or more shift registers. Accordingly, the display device may display an abnormal image, a switch for switching a clock signal and a switch for switching the gate-off voltage may be simultaneously turned on to make short circuit, and signal lines or power supplying lines provided on the display panel may be overloaded to be disconnected.

SUMMARY OF THE INVENTION

A motivation of the present invention is to prevent a latch-up in a display device.

The display device includes a plurality of pixels including switching elements.

A driving device of the display device includes a gate driver including a series of shift registers. Each shift register generates an output determined by charging and discharging of a capacitor. The charging of the capacitor is blocked by an output of a next shift register or a signal synchronized with the output of the next shift register or the discharging of the capacitor is blocked by an output of a previous shift register or a signal synchronized with the output of the previous shift register.

Each shift register preferably includes a first switching element for switching a first voltage applied to the capacitor in response to the output of the previous shift register or the signal synchronized with the output of the previous shift register; a second switching element for switching a second voltage applied to the capacitor in response to the output of the next shift register or the signal synchronized with the output of the next shift register; and a voltage blocking unit for blocking the first voltage or the second voltage.

According to an embodiment of the present invention, the voltage blocking unit pulls down a voltage at an input terminal of the first switching element to the second voltage in response to the output of the next shift register or the signal synchronized with the output of the next shift register.

The voltage blocking unit includes a resistive element connected between the first voltage and the first switching element; and a third switching element connected between the resistive element and the second voltage and has a control terminal for receiving the output of the next shift register or the signal synchronized with the output of the next shift register.

According to another embodiment of the present invention, the voltage blocking unit pulls down a voltage at a control terminal of the first switching element to the second voltage in response to the output of the next shift register or the signal synchronized with the output of the next shift register.

The voltage blocking unit includes a resistive element connected between the output of the previous shift register and the first switching element; and a third switching element connected between the resistive element and the second voltage and has a control terminal for receiving the output of the next shift register or the signal synchronized with the output of the next shift register.

According to another embodiment of the present invention, the voltage blocking unit pulls down a voltage at a control terminal of the second switching element to the second voltage in response to the output of the previous shift register or the signal synchronized with the output of the previous shift register.

The voltage blocking unit includes a resistive element connected between the output of the next shift register and the second switching element; and a third switching element connected between the resistive element and the second voltage and has a control terminal for receiving the output of the previous shift register or the signal synchronized with the output of the previous shift register.

Preferably, the first voltage is larger than a threshold voltage of the switching elements and the second voltage is smaller than a threshold voltage of the switching elements.

DETAILED DESCRIPTION OF EMBODIMENTS

The present invention now will be described more fully hereinafter with reference to the accompanying drawings, in which preferred embodiments of the invention are shown. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Then, display devices including liquid crystal displays and driving devices thereof will be described in detail with reference to accompanying drawings.

Figure 1:
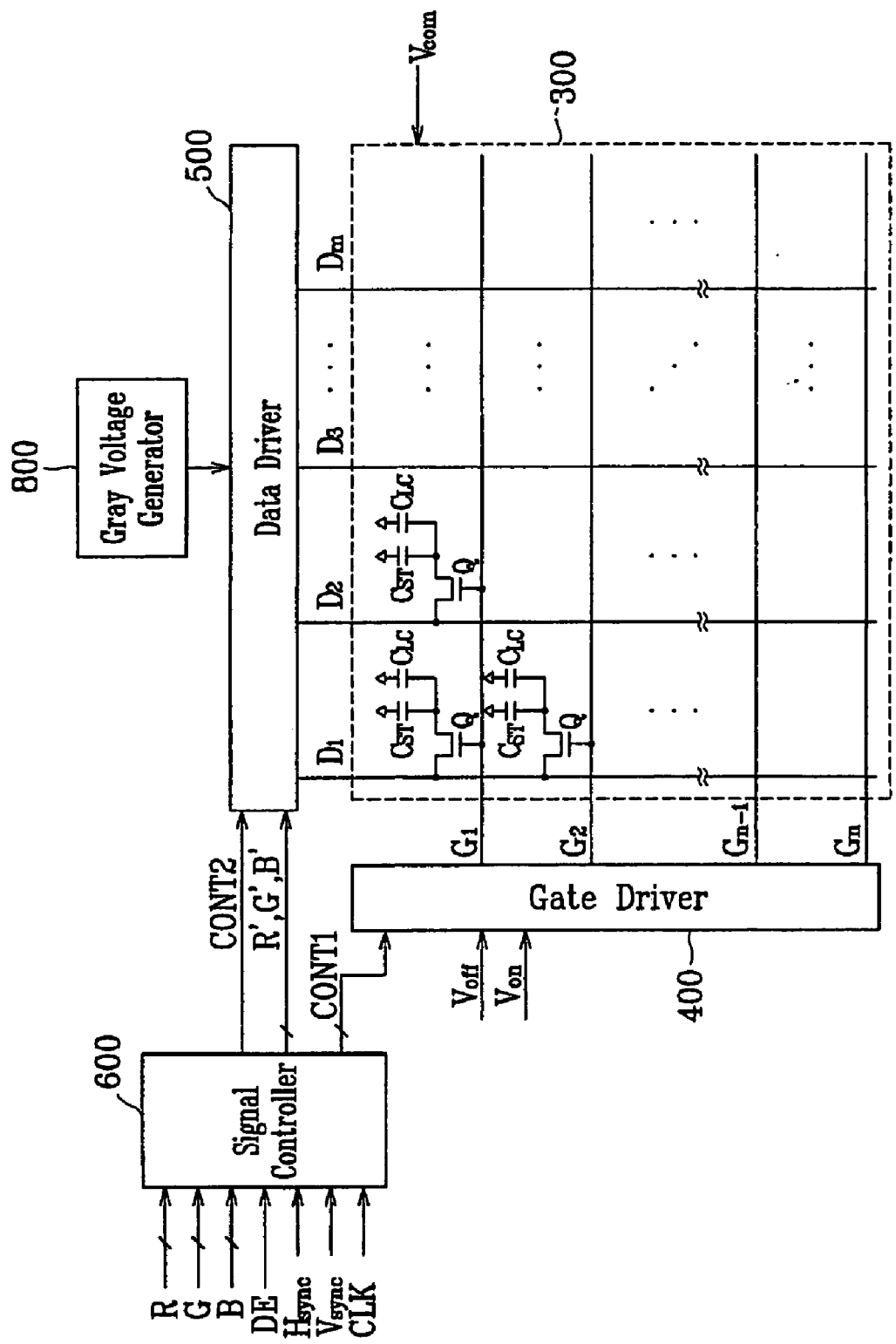
FIG. 1 is a block diagram of an LCD according to an embodiment of the present invention.
Figure 2:
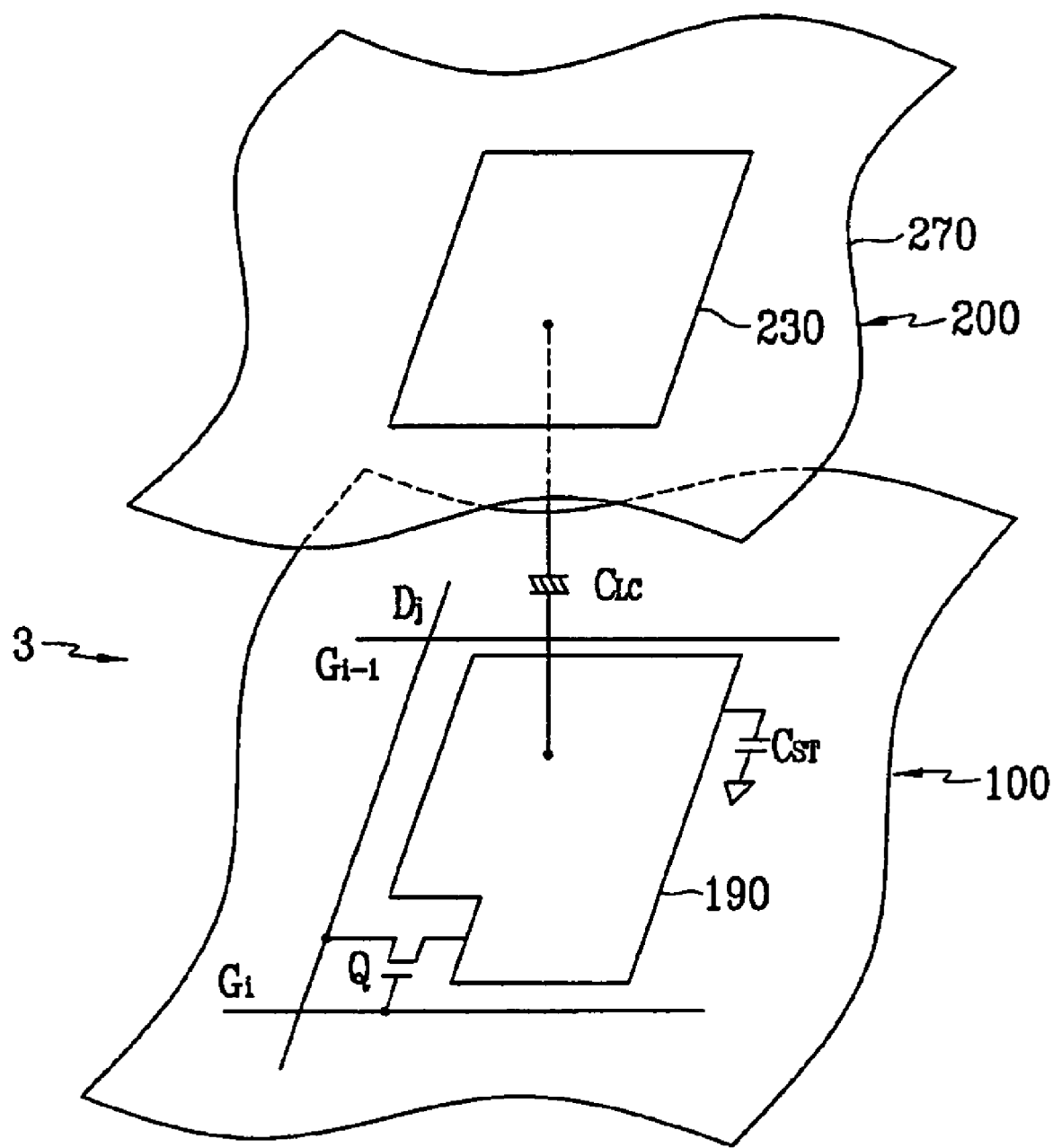
FIG. 2 is an equivalent circuit diagram of a pixel of an LCD according to an embodiment of the present invention.

FIG. 1 is a block diagram of an LCD according to an embodiment of the present invention, and FIG. 2 is an equivalent circuit diagram of a pixel of an LCD according to an embodiment of the present invention.

Referring to FIG. 1, an LCD according to an embodiment includes a liquid crystal (LC) panel assembly 300, a gate driver 400 and a data driver 500 which are connected to the panel assembly 300, a gray voltage generator 800 connected to the data driver 500, and a signal controller 600 controlling the above-described elements.

In circuital view, the panel assembly 300 includes a plurality of display signal lines $G_1$-$G_n$ and $D_1$-$D_m$ and a plurality of pixels connected thereto and arranged substantially in a matrix.

The display signal lines $G_1$-$G_n$ and $D_1$-$D_m$ include a plurality of gate lines $G_1$-$G_n$ transmitting gate signals (also referred to as "scanning signals"), and a plurality of data lines $D_1$-$D_m$ transmitting data voltages. The gate lines $G_1$-$G_n$ extend substantially in a row direction and substantially parallel to each other, while the data lines $D_1$-$D_m$ extend substantially in a column direction and substantially parallel to each other.

Each pixel includes a switching element Q connected to the signal lines $G_1$-$G_n$ and $D_1$-$D_m$, and a LC capacitor $C_{LC}$ and a storage capacitor $C_{ST}$ that are connected to the switching element Q. If necessary, the storage capacitor $C_{ST}$ may be omitted.

The switching element Q is provided on a lower panel 100 and has three terminals, a control terminal connected to one of the gate lines $G_1$-$G_n$, an input terminal connected to one of the data lines $D_1$-$D_m$ and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on an upper panel 200 as two terminals. The LC layer 3 disposed between the two electrodes 190 and 270 functions as dielectric of the LC capacitor $C_{LC}$. The pixel electrode 190 is connected to the switching element Q and the common electrode 270 is connected to the common voltage Vcom and covers entire surface of the upper panel 200. Unlike FIG. 2, the common electrode 270 may be provided on the lower panel 100, and both electrodes 190 and 270 have shapes of bar or stripes.

The storage capacitor $C_{ST}$ is defined by the overlap of the pixel electrode 190 and a separate wire (not shown) provided on the lower panel 100 and applied with a predetermined voltage such as the common voltage Vcom. Otherwise, the storage capacitor is defined by the overlap of the pixel electrode 190 and its previous gate line $G_{i-1}$ via an insulator.

For color display, each pixel can represent its own color by providing one of a plurality of red, green and blue color filters 230 in an area corresponding to the pixel electrode 190. The color filter 230 shown in FIG. 2 is provided in the corresponding area of the upper panel 200. Alternatively, the color filters 230 are provided on or under the pixel electrode 190 on the lower panel 100.

A polarizer or a pair of polarizers (not shown) are provided on outer surfaces of the panel assembly 300.

Referring to FIG. 1 again, the gray voltage generator 800 generates two sets of a plurality of gray voltages related to the transmittance of the pixels. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel assembly 300 and applies gate signals from an external device to the gate lines $G_1$-$G_n$, each gate signal being a combination of a gate-on voltage Von and a gate-off voltage Voff.

The data driver 500 is connected to the data lines $D_1$-$D_m$ of the panel assembly 300 and selects gray voltages from the gray voltage generator 800 to apply as data signals to the data lines $D_1$-$D_m$.

The signal controller 600 controls the gate driver 400 and the data driver 500.

Now, the operation of the LCD is described in detail.

The signal controller 600 is supplied from an external graphic controller (not shown) with RGB image signals R, G and B and input control signals controlling the display thereof. The input control signals include a vertical synchronization signal Vsync, a horizontal synchronization signal Hsync, a main clock CLK, a data enable signal DE, and so on. The signal controller 600 processes the input image signal R, G and B such that the processed images signals R', G' and B' are suitable for the panel assembly 300, and it generates a plurality of gate control signals CONT1 and a plurality of data control signals CONT2 on the basis of the input control signals and the input image signals R, G and B. The signal controller 600 provides the gate control signals CONT1 for the gate driver 400 and the processed image signals R', G' and B' and the data control signals CONT2 for the data driver 500.

The gate control signals CONT1 include a vertical synchronization start signal STV for instructing start of outputting the gate-on voltage Von, a gate clock signal CPV for controlling the output time of the gate-on voltage Von and an output enable signal OE for defining the durations of the gate-on voltage Von. The data control signals CONT2 include a horizontal synchronization start signal STH for informing of start of input of the processed image signals R', G' and B', a load signal LOAD for instructing to apply the appropriate data voltages to the data lines $D_1$-$D_m$, an inversion control signal RVS for reversing the polarity of the data voltages (with respect to the common voltage Vcom), and a data clock signal HCLK.

The data driver 500 receives a packet of the image data R', G' and B' for a pixel row from the signal controller 600, converts the image data R', G' and B' into analog data voltages selected from the gray voltages from the gray voltage generator 570, and applies the data voltages into the data lines $D_1$-$D_m$ in response to the data control signals CONT2 from the signal controller 600.

Responsive to the gate control signals CONT1 from the signal controller 600, the gate driver 400 applies the gate-on voltage Von to the gate line $G_1$-$G_n$, thereby turning on the switching elements Q connected thereto.

Then, the data voltages are supplied to the corresponding pixels via the turned-on switching elements Q.

After a horizontal period (which is often indicated by "1H" and equal to one periods of the horizontal synchronization signal Hsync, the data enable signal DE, and the gate clock signal CPV), the scanning operation for the next pixel row is performed. By repeating this procedure, all gate lines $G_1$-$G_n$ are sequentially supplied with the gate-on voltage Von during a frame, thereby applying the data voltages to all pixels. When the next frame starts after finishing one frame, the inversion control signal RVS applied to the data driver 500 is controlled such that the polarity of the data voltages is reversed (which is called "frame inversion"). The inversion control signal RVS may be also controlled such that the polarity of the data voltages flowing in a data line in one frame are reversed (which is called "line inversion"), or the polarity of the data voltages in one packet are reversed (which is called "dot inversion").

Now, configurations and operations of a gate driver according to embodiments of the present invention are described in detail with reference to FIGS. 3-6.

Figure 3:
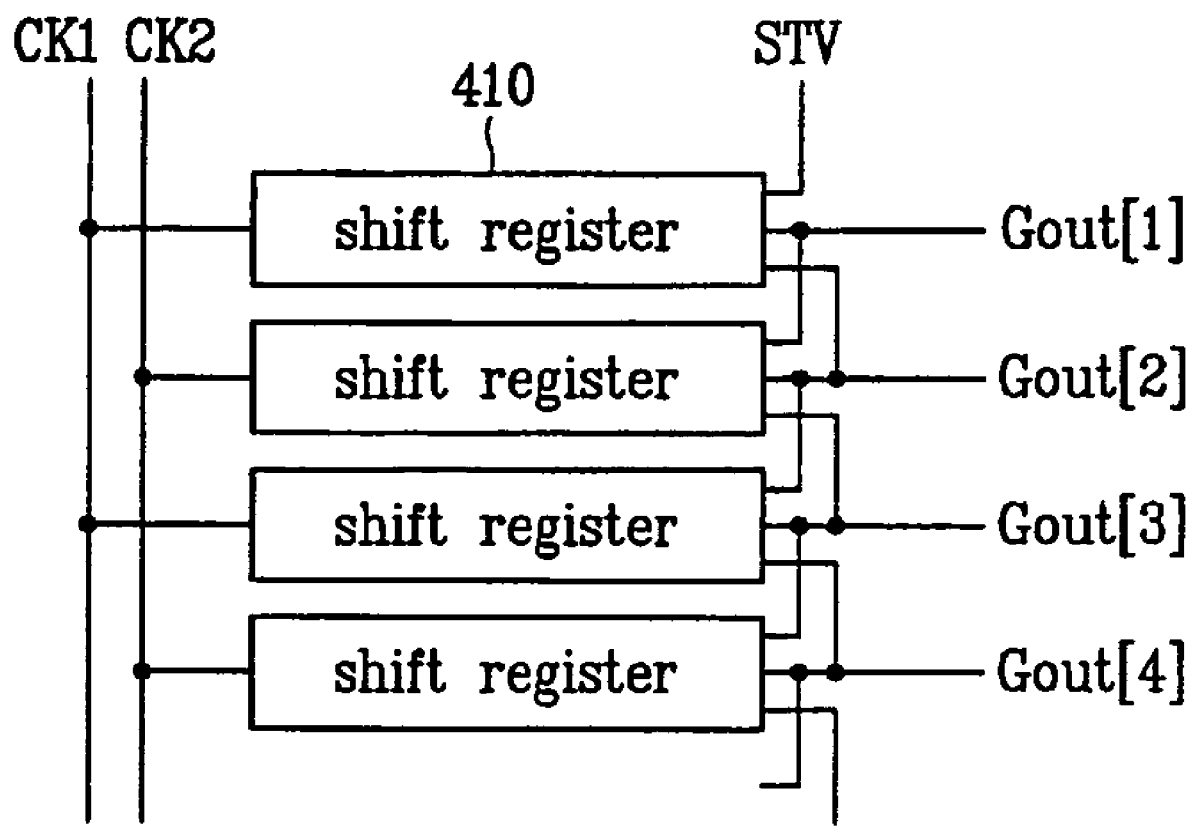
FIG. 3 is a block diagram of a gate driver according to an embodiment of the present invention.

FIG. 3 is a block diagram of a gate driver according to an embodiment of the present invention.

Referring to FIG. 3, a gate driver 400 according to an embodiment of the present invention includes a series of shift registers 410, which may be integrated onto the panel assembly 300 along with the switching elements of the pixels using the same manufacturing process.

Each shift register 410 generates a gate output Gout(N) based on a previous gate output Gout(N−1) and a next gate output Gout(N+1) in synchronization with one of a pair of clock signal CK1 and CK2 having inverted phases and a period of 2H. Adjacent shift registers 410 are supplied with different clock signals CK1 and CK2. Each of the clock signals CK1 and CK2 has a high value equal to the gate-on voltage Von and a low value equal to the gate-off voltage Voff for driving the switching elements Q of the pixels. For the switching elements Q of amorphous silicon TFTs, the magnitude of the gate-on voltage Von is preferably equal to or higher than about 20V and the magnitude of the gate-off voltage Voff is preferably equal to or lower than about −10V.

Figure 4:
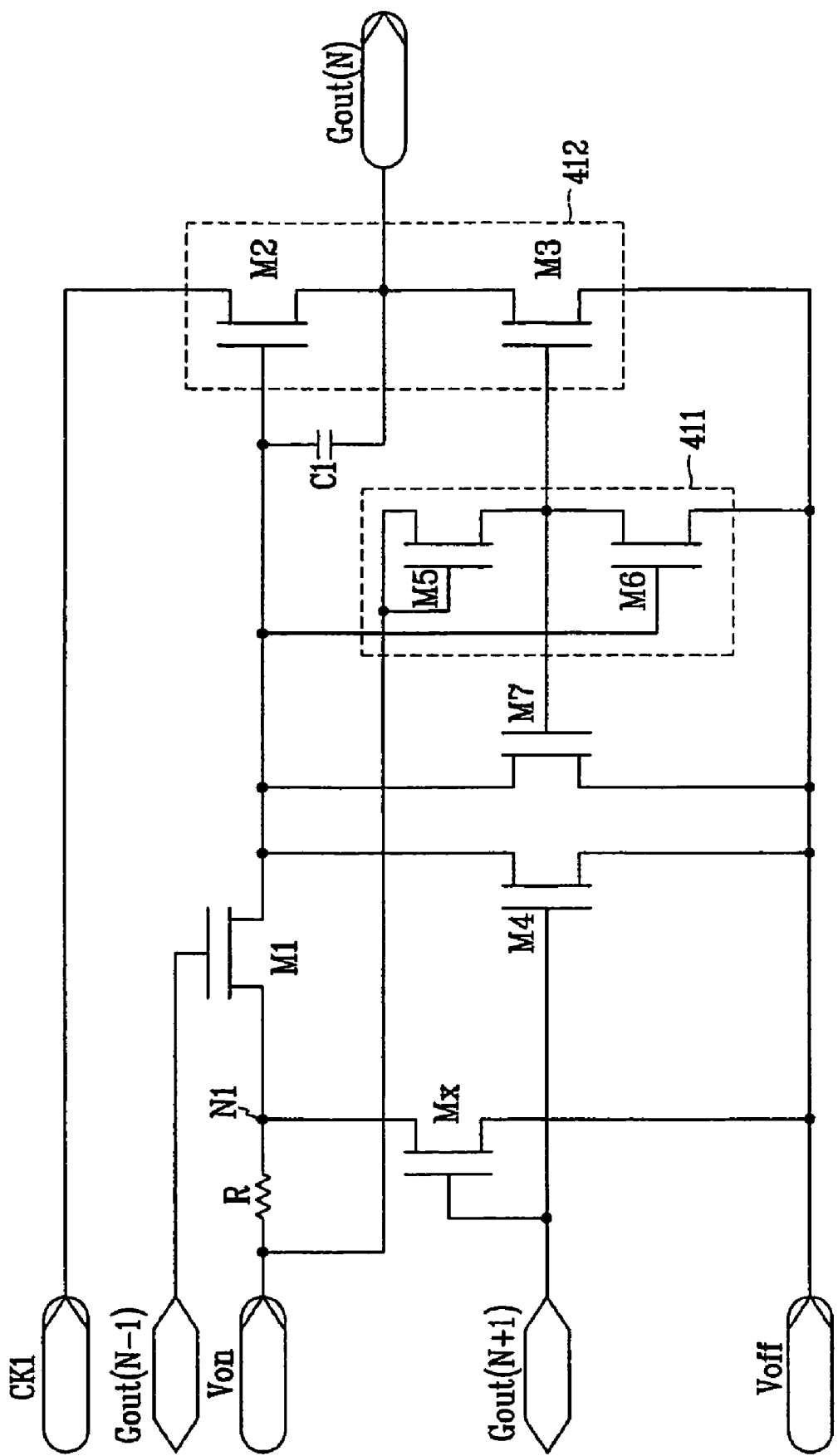
FIG. 4 is a detailed circuit diagram of a shift register for a gate driver according to an embodiment of the present invention.
Figure 5:
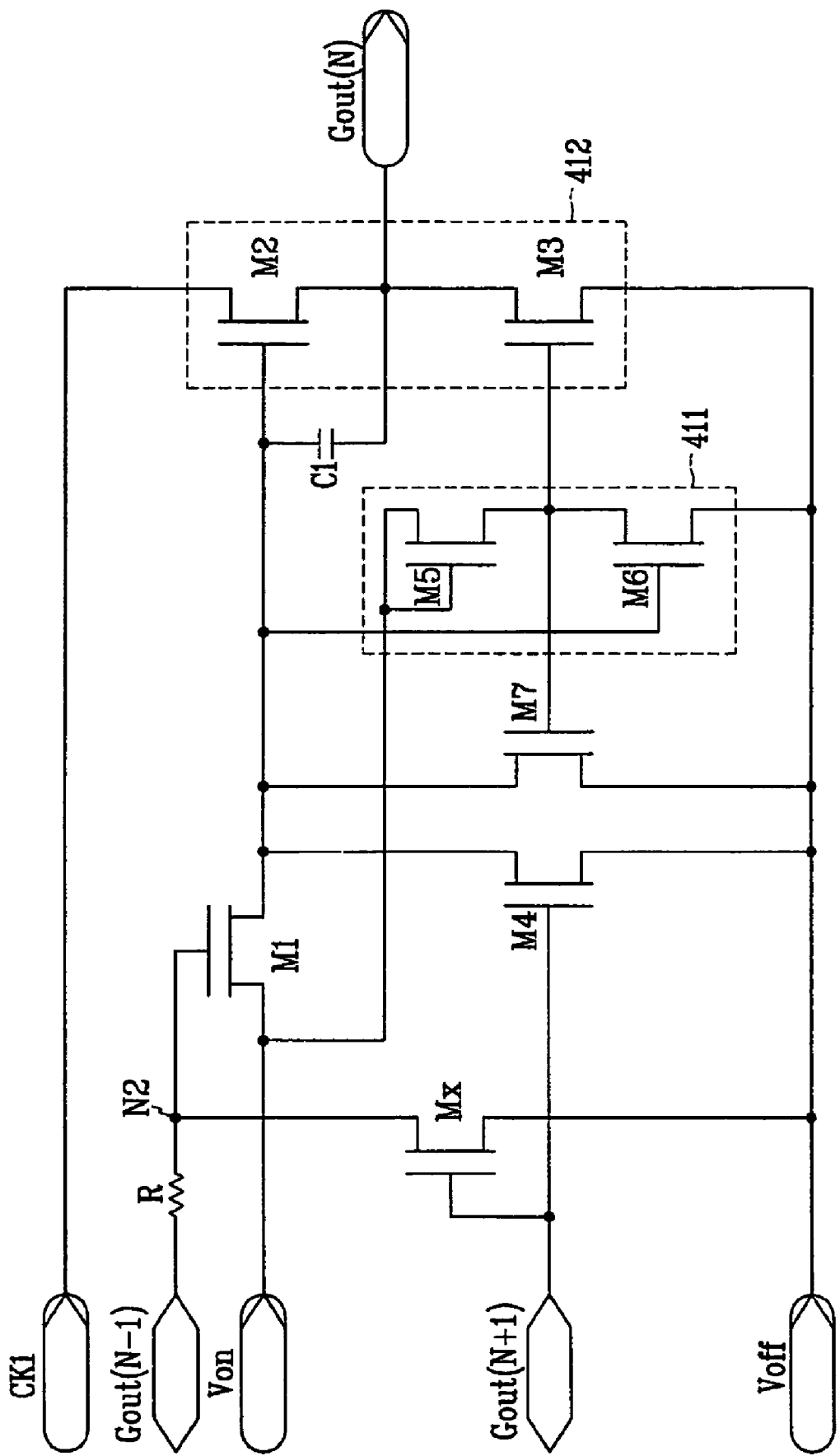
FIG. 5 is a detailed circuit diagram of a shift register for a gate driver according to another embodiment of the present invention.
Figure 6:
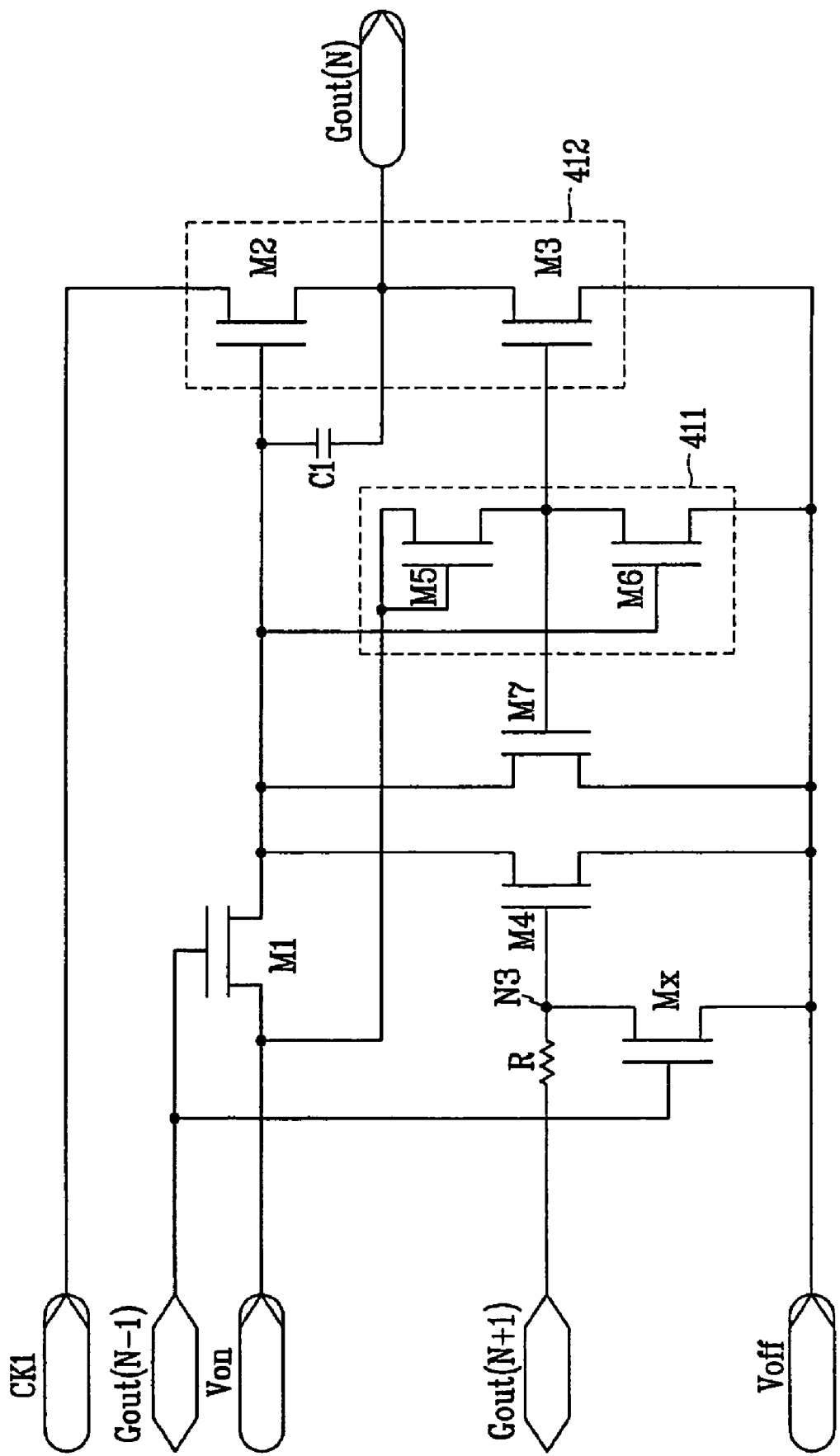
FIG. 6 is a detailed circuit diagram of a shift register for a gate driver according to another embodiment of the present invention.

FIGS. 4-6 are detailed circuit diagrams of a shift register for a gate driver according to embodiments of the present invention.

The shift register shown in FIGS. 4-6 is an N-th shift register, which receives a previous gate output Gout(N−1), a next gate output Gout(N+1), a clock signal CK1 as well as the gate-on voltage Von and the gate-off voltage Voff. It is noted that the gate-on voltage Von shown in FIG. 4 is inputted through a resistor R, the previous gate output Gout(N−1) shown in FIG. 5 is inputted through a resistor R, and the next gate output Gout(N+1) shown in FIG. 6 is inputted through a resistor R.

The shift register 410 includes a plurality of NMOS transistors including a buffer transistor M1, a driving portion 412 including first and second driving transistors M2 and M3, a discharging transistor M4, an inverting portion 411 including first and second inverter transistors M5 and M6, a hold transistor M7, and a pull-down transistor Mx as well as a resistor R, and a capacitor C1. Instead of NMOS transistors, PMOS transistors are alternatively employed. The capacitor C1 and the resistor R are equivalent circuit elements introduced for descriptive convenience. The capacitor C1 may represent a parasitic capacitance between a gate and drain/source, and the resistor R may be realized by an active resistive element such as a transistor.

The first and the second driving transistors M2 and M3 are connected in series between the clock signal CK1 and the gate-off voltage Voff, and the capacitor C1 is connected between a node between the driving transistors M2 and M3 and a gate of the first driving transistor M2. The buffer transistor M1 is connected between the gate of the first driving transistor M2 and the gate-on voltage Von, and it has a gate connected to the previous gate output Gout(N−1). The first and the second inverter transistors M5 and M6 are connected in series between the gate-on voltage Von and the gate-off voltage Voff. The first inverter transistor M5 has a gate and a source connected to each other, the second inverter transistor M6 has a gate connected to an output of the buffer transistor M1, and the second driving transistor M3 has a gate connected to a node between the first inverter transistor M5 and the second inverter transistor M6. The discharging transistor M4 and the hold transistor M7 are connected in parallel between the gate-off voltage Voff and an output of the buffer transistor M1. The discharging transistor M4 has a gate connected to the next gate output Gout(N+1), and the hold transistor M7 has a gate connected to the gate of the second driving transistor M3.

The pull-down transistor Mx shown in FIG. 4 is connected between the gate-on voltage Von and the gate-off voltage Voff, and it has a gate connected to the next gate output Gout(N+1).

The pull-down transistor Mx shown in FIG. 5 is connected between the previous gate output Gout(N−1) and the gate-off voltage Voff, and it has a gate connected to the next gate output Gout(N+1).

The pull-down transistor Mx shown in FIG. 6 is connected between the next gate output Gout(N+1) and the gate-off voltage Voff, and it has a gate connected to the previous gate output Gout(N−1).

An operation of the gate driver is described in detail with reference to FIGS. 7A and 7B.

Figure 7A:
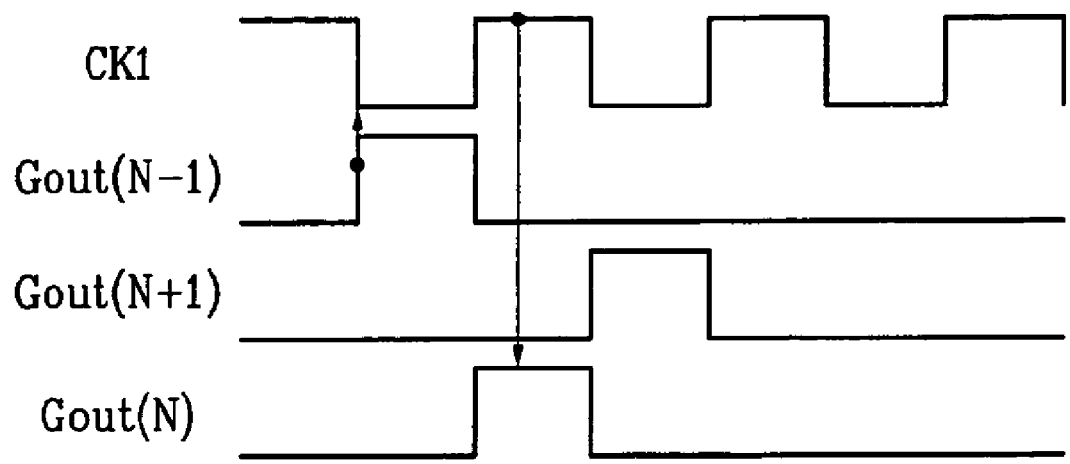
FIGS. 7A and 7B are exemplary timing charts of a shift register of a gate driver shown in FIG. 4-6.
Figure 7B:
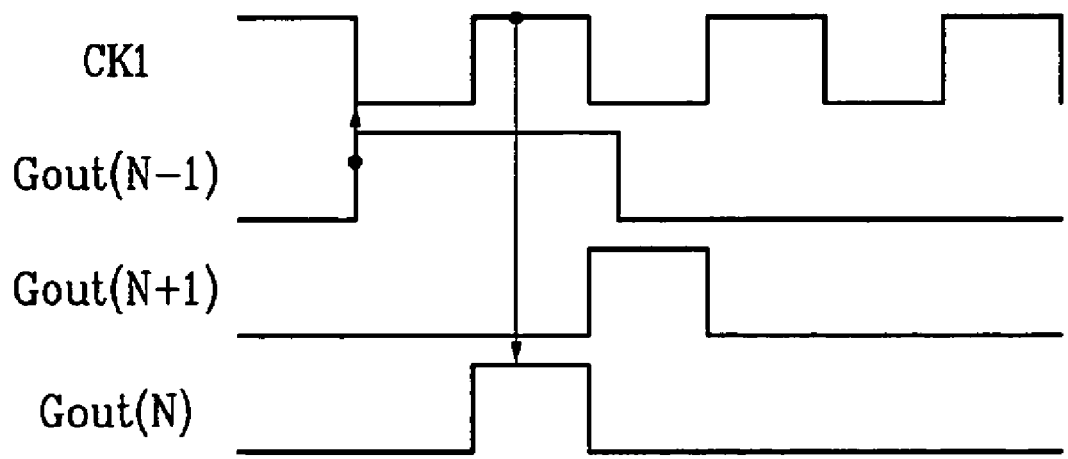

FIGS. 7A and 7B are exemplary timing charts of a shift register of a gate driver shown in FIG. 4-6. FIG. 7A is the timing chart for a normal operation, while FIG. 7B is the timing chart for abnormal operation.

First, operations of the first and the second inverter transistors M5 and M6 are described and a whole operation of the shift register is described next. The operation of the shift register shown in FIG. 6 will be separately described later.

Referring to FIGS. 4 and 5, when the pull-down transistor Mx is in an off state, the first inverter transistor M5 maintains its on state since its gate is supplied with the gate-on voltage Von. The voltage of the node between the first inverter transistor M5 and the second inverter transistor M6 is substantially equal to the gate-on voltage Von when the second inverter transistor M6 is in an off state. On the contrary, when the second inverter transistor M6 is in the on state, the node voltage has a magnitude equal to a voltage value divided by the internal resistances of the turned-on two transistors M5 and M6 in their resistive states, which is nearly equal to a mid-value between the gate-on voltage Von and the gate-off voltage Voff. Accordingly, the hold transistor M7 and the second driving transistor M3 are turned on when the second inverter transistor M6 is turned off, and vice versa.

The buffer transistor M1 is in the off state in an initial state where both the previous gate output Gout(N−1) and the next gate output Gout(N+1) are low. In addition, the buffer transistor M1, the pull-down transistor Mx, and the second inverter transistor M6 are also in the off states, while the second driving transistor M3 and the hold transistor M7 are in the on states. When the hold transistor M7 is turned of, the gate-off voltage Voff is applied to the gate of the first driving transistor M2 and thus the first driving transistor M2 is turned off. Accordingly, the gate output Gout(N) is low.

When the previous gate output Gout(N−1) becomes high while the next gate output Gout(N+1) maintains its low state, the buffer transistor M1 is turned off. Therefore, the first driving transistor M2 and the second inverter transistor M6 are turned on, and the second driving transistor M3 and the hold transistor M7 are turned off. Accordingly, the gate output Gout(N) has the same waveform as the clock signal CK1. When the clock signal CK1 is low, the gate output Gout(N) is also low, and the capacitor C1 is supplied with and stores a voltage approximately equal to the gate-on voltage Von.

When the previous gate output Gout(N−1) becomes low again while the next gate output Gout(N+1) maintains its low state, the voltage stored in the capacitor C1 maintains the on state of the first driving transistor M2. Since the clock signal CK1 becomes high, the gate output Gout(N) becomes high and thus the voltage applied to the gate of the first driving transistor M2 becomes higher in order to maintain the voltage charged in the capacitor C1. Accordingly, the second inverter transistor M6 is turned on and thus the second driving transistor M3 and the hold transistor M7 maintain their off states.

When the next gate output Gout(N+1) becomes high, while the previous gate output Gout(N−1) maintains its low state, the discharging transistor M4 is turned on and thus the second inverter transistor M6 is turned off, while the second driving transistor M3 and the hold transistor M7 are turned on. Accordingly, both terminals of the capacitor C1 are supplied with the gate-off voltage Voff, and thus the voltage stored in the capacitor C1 is discharged, the first driving transistor M2 is turned off, and the gate output Gout(N) becomes low.

In the meantime, the gate output Gout(N) becomes high in synchronization with a rising edge of the corresponding clock signal CK1 or CK2 as described above. As shown in FIG. 7A, if the current shift register receives the clock signal CK1, previous and next shift registers receives the clock signal CK2, which has an inverted phase with respect to the clock signal CK1. Accordingly, the previous and the next gate outputs Gout(N−1) and Gout(N+1) become high in synchronization with the rising edges of the clock signal CK2, i.e., in synchronization with the falling edges of the clock signal CK1. Since the high section of each gate output maintains for 1H, the previous, the current, and the next gate outputs Gout(N−1), Gout(N) and Gout(N+1) become high in sequence.

Instead of the previous and the next gate output signals Gout(N−1) and Gout(N+1), any signals synchronized therewith may be inputted.

Figure 8A:
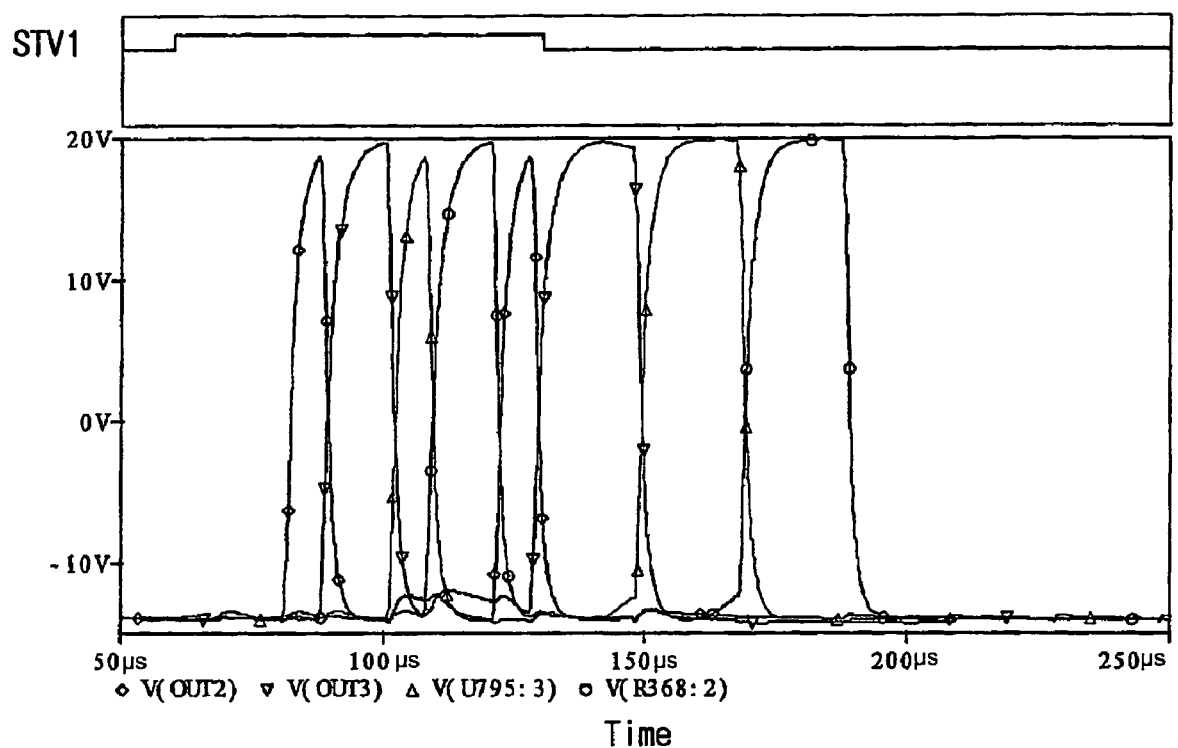
FIG. 8A shows waveforms of signals of a gate driver according to an embodiment of the present invention.
Figure 8B:
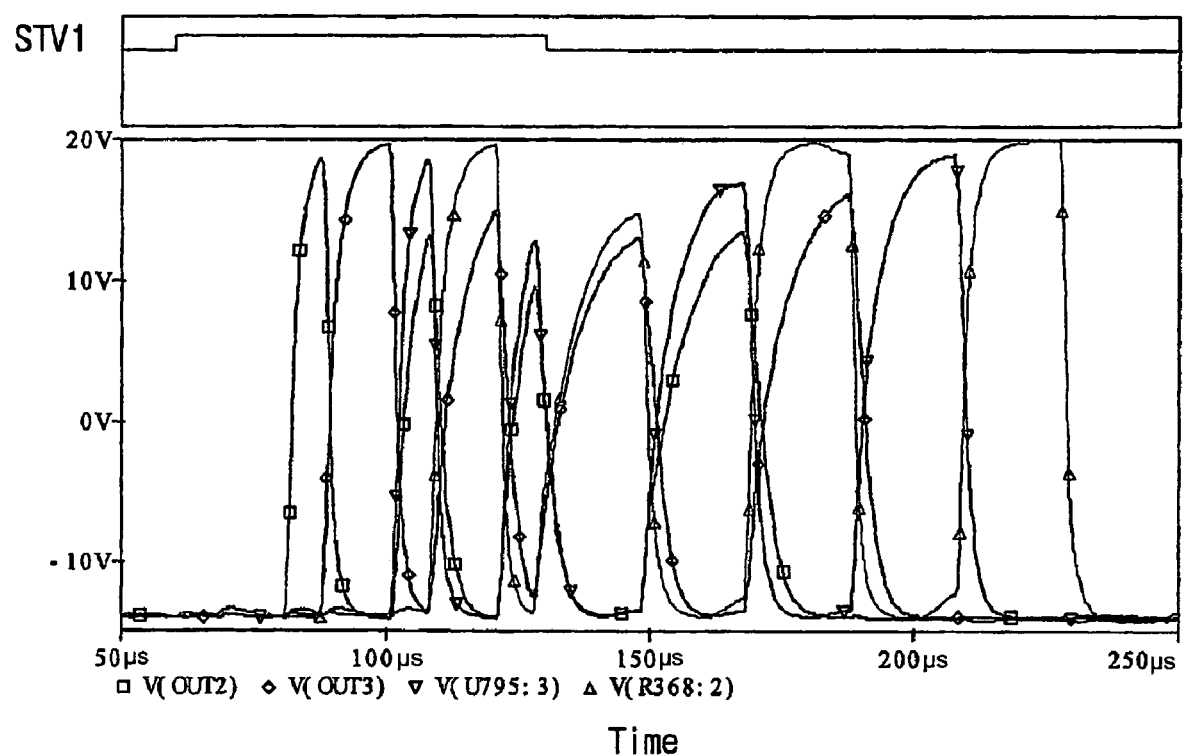
FIG. 8B shows waveforms of signals of a conventional gate driver.

In the meantime, the vertical synchronization start signal STV or the high section of the previous gate output Gout(N−1) is elongated to have a duration longer than 2H due to some reasons as shown in FIG. 8B. During the low section of the next gate output Gout(N+1), the buffer transistor M1 continues to be in its on state. Then, since the gate output Gout(N) has the same waveform as the clock signal CK1, when the clock signal CK1 becomes high after 1H, the gate output Gout(N) also becomes high. When the clock signal CK1 becomes low after 2H, the capacitor C1 starts to charging operation again. At the same time, the next gate output Gout(N+1) becomes high. Since the next gate output Gout(N+1) is high, the pull-down transistor Mx is turned on.

Referring to FIG. 4, the previous gate output Gout(N−1) is still high, and thus the buffer transistor M1 maintains its on state, while the capacitor C1 tends to continue it charging operation. However, an input node N1 of the gate-on voltage Von is supplied with the gate-off voltage Voff due to the turn-on of the pull-down transistor Mx, and thus the voltages applied to both terminals of the capacitor C1 are the same. Consequently, the capacitor C1 stops its charging operation and the gate output Gout(N) becomes low.

Referring to FIG. 5, the turn-on of the pull-down transistor Mx make the gate of the buffer transistor M1 supplied with the gate-off voltage Voff. Accordingly, the buffer transistor M1 is turned off and thus the gate output Gout(N) becomes low.

As a result, the pull-down transistor Mx blocks the gate-on voltage Von applied to the capacitor C1 when the next gate output Gout(N−1) becomes high such that it stops the charging of the capacitor C1 and turns off the first driving transistor M2 to block the output of the clock signal CK1 and to make the gate-off voltage Voff be outputted. The blocking of the gate-on voltage Von applied to the capacitor C1 is performed in such a way that the gate-off voltage Voff instead of the gate-on voltage Von is applied to the buffer transistor M1 as shown in FIG. 4, or the buffer transistor M1, which transmits the gate-on voltage Von, is turned off as shown in FIG. 5.

Although the above description is based on an assumption that the transistors do not have resistance in their turn off states, the resistances may be considered since the MOS transistors serve as resistors depending on the applied voltages.

Considering the turn-on resistance Rx of the pull-down transistor Mx, the voltages of the nodes N1 and N2 are determined by the resistances R and Rx. Accordingly, it is preferable that the resistance R is very large compared with the resistance Rx such that the voltages of the nodes N1 and N2 are closes to the gate-off voltage Voff.

However, since it is preferable that the resistor R transmits the gate-on voltage Von without voltage drop when the pull-down transistor Mx is turned off, it is preferable that the resistor R is rather an active element such as a transistor than a normal resistor.

In addition, referring to FIG. 5, the buffer transistor M1 is considered to be in a pull-down state due to the voltage at the node N2 not in the off state when the pull-down transistor Mx is turned on. In this case, the voltage V(C1) across the capacitor C1 is determined by:

$$V(C1)=Ron/(Ron+Rdown)\times Von, \quad (1)$$

where Ron is a turn-on resistance of the discharging transistor M4 and Rdown is a pull-down resistance of the buffer transistor M1. The voltage V(C1) is lower than the threshold voltage Vth of the inverter transistor M6 such that the second driving transistor M3 is turned on to make the gate output Gout(N) in the low state, the resistance R is determined such that:

$$Ron/(Ron+Rdown)\times Von<Vth. \quad (2)$$

Accordingly, it is preferable that the resistance R is much larger than the internal resistance Rx of the pull-down transistor Mx such that the voltage at a node N2 is as close as the gate-off voltage Voff.

Now, a shift register according to another embodiment of the present invention is described in detail with reference to FIG. 6.

As shown in FIG. 6, the pull-down transistor Mx is connected between the next gate output Gout(N+1) and the gate-off voltage Voff and a control terminal of the pull-down transistor Mx is connected to the previous gate output Gout(N−1).

Although the shift register shown in FIGS. 4 and 5 connects the pull-down transistor Mx to the input terminal and the control terminal of the buffer transistor M1, respectively, such that the pull-down transistor Mx blocks the gate-on voltage Von applied to the capacitor C1 to prevent the charging of the capacitor, the shift register shown in FIG. 6 connects the pull-down transistor Mx to a control terminal of the discharging transistor M4 such that the pull-down transistor Mx blocks the gate-off voltage Voff applied to the capacitor C1 to prevent the discharging of the capacitor C1.

This operation is described hereinafter.

Since the transistors except for the buffer transistor M1 and the discharging transistor M4 perform substantially the same operations as those shown in FIGS. 4 and 5, the description thereof is omitted and the operations of the buffer transistor M1 and the discharging transistor M4 are described in detail.

As described above, when the next gate output Gout(N+1) is high, the discharging transistor M4 is in the on state, and thus the capacitor C1 is discharged. At this time, if the previous gate output Gout(N−1) becomes high, the pull-down transistor Mx is turned on and thus the voltage applied to an input terminal N3 of the discharging transistor M4 is pulled down to the gate-off voltage Voff such that the discharging transistor M4 is turned off.

At the same time, the control terminal of the buffer transistor M1 is applied to a high voltage such that the buffer transistor M1 is turned on and thus the capacitor C1 is supplied with and starts to charge the gate-on voltage Von.

Like the embodiments shown in FIGS. 4 and 5, the resistance R is determined to be much higher than the resistance Rx of the pull-down transistor Mx such that the voltage at the node N3 is as close as the gate-off voltage Voff.

FIG. 8A shows waveforms of signals of a gate driver according to an embodiment of the present invention, and FIG. 8B shows waveforms of signals of a conventional gate driver.

As shown in FIGS. 8A and 8B, when a high section of the vertical synchronization start signal is longer than 2H, a gate driver according to an embodiment of the present invention generates a normal output, while a conventional gate driver generates abnormal signals overlapping each other.

In this way, simultaneous high outputs of the previous gate output and the next gate output due to abnormal image signals are prevented by providing the pull-down transistor Mx for preventing simultaneous charging and discharging of the capacitor C1.

The present invention is also applicable to any active matrix type display device such as an organic EL display.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A driving device of a display device including a plurality of pixels including switching elements, the driving device comprising:
   a gate driver including a series of shift registers, wherein each shift register of the series of shift registers generates an output determined by charging and discharging of a capacitor,
   the charging of the capacitor is blocked by one of an output of a next shift register of the series of shift registers and a signal synchronized with the output of the next shift register,
   the discharging of the capacitor is blocked by one of an output of a previous shift register of the series of shift registers and a signal synchronized with the output of the previous shift register, and
   each shift register of the series of shift registers comprises a voltage blocking unit for blocking one of a first voltage and a second voltage in response to one of the output of the next shift register and the output of the previous shift register.

2. The driving device of claim 1, wherein each shift register of the series of shift registers further comprises:
   a first switching element for switching the first voltage applied to the capacitor in response to the output of the previous shift register or the signal synchronized with the output of the previous shift register; and
   a second switching element for switching the second voltage applied to the capacitor in response to the output of the next shift register or the signal synchronized with the output of the next shift register.

3. The driving device of claim 2, wherein the voltage blocking unit pulls down a voltage at an input terminal of the first switching element to the second voltage in response to the output of the next shift register or the signal synchronized with the output of the next shift register.

4. The driving device of claim 3, wherein the voltage blocking unit comprises:
a resistive element connected between the first voltage and the first switching element; and
a third switching element connected between the resistive element and the second voltage and has a control terminal for receiving the output of the next shift register or the signal synchronized with the output of the next shift register.

5. The driving device of claim 2, wherein the voltage blocking unit pulls down a voltage at a control terminal of the first switching element to the second voltage in response to the output of the next shift register or the signal synchronized with the output of the next shift register.

6. The driving device of claim 5, wherein the voltage blocking unit comprises:
a resistive element connected between the output of the previous shift register and the first switching element; and
a third switching element connected between the resistive element and the second voltage and has a control terminal for receiving the output of the next shift register or the signal synchronized with the output of the next shift register.

7. The driving device of claim 2, wherein the voltage blocking unit pulls down a voltage at a control terminal of the second switching element to the second voltage in response to the output of the previous shift register or the signal synchronized with the output of the previous shift register.

8. The driving device of claim 7, wherein the voltage blocking unit comprises:
a resistive element connected between the output of the next shift register and the second switching element; and
a third switching element connected between the resistive element and the second voltage and has a control terminal for receiving the output of the previous shift register or the signal synchronized with the output of the previous shift register.

9. The driving device of claim 2, wherein the first voltage is larger than a threshold voltage of the switching elements and the second voltage is smaller than a threshold voltage of the switching elements.

10. The driving device of claim 1, wherein the shift register is incorporated into the display device.

11. A driving device of a display device comprising:
a gate driver including a plurality of shift registers,
wherein each of the shift registers comprises:
a first input terminal receiving a first input signal,
a first switching element having a control terminal, an output terminal and an input terminal which receives a clock signal,
a capacitor connected between the control terminal and the output terminal of the first switching element,
a second input terminal which receives a second input signal,
an inverter which outputs an output signal according to the first input signal,
a pull-down element controlled by the second input signal so as to discharge the capacitor, and
a hold element controlled by the output signal of the inverter so as to discharge the capacitor,
wherein the capacitor is charged according to the first input signal, and
wherein the output signal of the inverter is high, when the first input signal is low, and the output signal of the inverter is low, when the first input signal is high.

12. The driving device of claim 11, wherein the pull-down element prevents the first signal from transmitting to the inverter, when the first input signal and the second input signal overlap.

13. The driving device of claim 11, wherein the first input signal is one of output signals of the former shift registers and the second input signal is one of the output signals of the latter shift registers.

14. The driving device of claim 11, wherein adjacent shift registers receive clock signals having different phases from each other.

15. The driving device of claim 14, wherein clock signals inputted to the shift register output the first input signal to the present shift register and the shift register outputs the second input signal to the present shift register have high periods not overlapping with the clock signal inputted to the present shift register.

16. The driving device of claim 11, wherein the shift register fun her comprise a third input terminal which receives a gate off voltage, and the third input terminal is connected to the inverter, the pull-down element and the hold element.

17. The driving device of claim 16, wherein the shift register further comprises a second switching element having an output terminal connected to the output terminal of the first switching element, a control terminal which receives the output signal of the inverter and an input terminal connected to the third input terminal.

* * * * *